US009094001B2

(12) United States Patent
Rozen et al.

(10) Patent No.: US 9,094,001 B2
(45) Date of Patent: Jul. 28, 2015

(54) INTEGRATED CIRCUIT AND METHOD FOR REDUCTION OF SUPPLY VOLTAGE CHANGES BY USING A CURRENT CONSUMING COMPONENT TO TEMPORARILY MODIFY OVERALL CURRENT CONSUMPTION BEFORE A NEWLY CHANGED INPUT SIGNAL BEING PROCESSED

(75) Inventors: Anton Rozen, Gederat (IL); Dan Kuzmin, Givat Shmuel (IL); Michael Priel, Hertzelia (IL)

(73) Assignee: Freescale Semiconductors, Inc., Austin, TX (US)

( * ) Notice: Subject to any disclaimer, the term of this patent is extended or adjusted under 35 U.S.C. 154(b) by 371 days.

(21) Appl. No.: 13/503,862

(22) PCT Filed: Nov. 12, 2009

(86) PCT No.: PCT/IB2009/055040
§ 371 (c)(1),
(2), (4) Date: Apr. 25, 2012

(87) PCT Pub. No.: WO2011/058393
PCT Pub. Date: May 19, 2011

(65) Prior Publication Data
US 2012/0218033 A1 Aug. 30, 2012

(51) Int. Cl.
*G06F 1/00* (2006.01)
*H03K 19/003* (2006.01)
*G06F 1/30* (2006.01)
*G06F 1/26* (2006.01)
*G06F 1/28* (2006.01)

(52) U.S. Cl.
CPC ............ *H03K 19/00346* (2013.01); *G06F 1/26* (2013.01); *G06F 1/28* (2013.01); *G06F 1/305* (2013.01)

(58) Field of Classification Search
CPC ........................................................ G05F 3/02
See application file for complete search history.

(56) References Cited

U.S. PATENT DOCUMENTS

| 6,252,384 | B1 * | 6/2001 | Arai et al. ..................... 323/282 |
| 6,333,670 | B1 | 12/2001 | Kono et al. |
| 6,523,129 | B1 * | 2/2003 | Tressler et al. ............... 713/340 |
| 7,016,249 | B2 | 3/2006 | Ross |

(Continued)

OTHER PUBLICATIONS

International Search Report and Written Opinion correlating to PCT/IB2009/055040 dated May 3, 2010.

*Primary Examiner* — Thomas Lee
*Assistant Examiner* — Zhipeng Wang

(57) ABSTRACT

An integrated circuit and a method. The integrated circuit includes an internal component having an output for providing a driven input signal; an output driver, connected to the internal component, for converting said driven input signal in an output signal; an output pad for outputting said output signal to a component outside the integrated circuit; a power grid configured to supply a supply voltage to the output driver; a controllable current consuming component connected to the power grid, said connectable current consuming component being controllable to consume current in accordance with a supply voltage change reduction pattern; a change detector connected to the internal component and the controllable current consuming component, for detecting a change in said driven input signal prior to said change resulting in a change in said output signal and to control said current consuming component to consume current in response to said detecting.

20 Claims, 9 Drawing Sheets

(56) References Cited

U.S. PATENT DOCUMENTS

| | | | |
|---|---|---|---|
| 7,091,630 B2* | 8/2006 | Asano | 307/34 |
| 2003/0023885 A1* | 1/2003 | Potter et al. | 713/300 |
| 2007/0188139 A1 | 8/2007 | Hussain et al. | |
| 2008/0001652 A1* | 1/2008 | Futamura et al. | 327/537 |
| 2008/0002983 A1* | 1/2008 | Ishikawa et al. | 398/139 |
| 2008/0191791 A1 | 8/2008 | Nomura et al. | |
| 2009/0063875 A1* | 3/2009 | Terazono | 713/300 |
| 2012/0117407 A1* | 5/2012 | Kanai et al. | 713/323 |

* cited by examiner

INTEGRATED CIRCUIT AND METHOD FOR REDUCTION OF SUPPLY VOLTAGE CHANGES BY USING A CURRENT CONSUMING COMPONENT TO TEMPORARILY MODIFY OVERALL CURRENT CONSUMPTION BEFORE A NEWLY CHANGED INPUT SIGNAL BEING PROCESSED

FIELD OF THE INVENTION

This disclosure relates generally to an integrated circuit and a method for reduction of supply voltage changes.

BACKGROUND OF THE INVENTION

Many modern electronic devices include multiple integrated circuits that are connected to a board, such as a Printed Circuit Board (PCB). Examples of such integrated circuits include a memory chip, a system on chip, a processor, a Direct Memory Access (DMA) controller and the like. These integrated circuits exchange signals over on-board conductors and receive a supply voltage over an on-board conductor. A supply voltage can for instance be sent to such an integrated circuit from a power management integrated circuit (PMIC).

Each integrated circuit includes input pads, output pads, input/output (IO) pads or a combination thereof. These pads are connected via a package of the integrated circuit to on-board conductors.

Each IO pad and output pad of the integrated circuit is connected to an output driver that assists in outputting the output signals from the integrated circuit. As will be illustrated below, changes in output signals may generate noise and cause unwanted changes in the supply voltage that is received by the output drivers. These noises reduce the signal-to-noise ratio (SNR) and accordingly can reduce the frequency of operation of the integrated circuit. This frequency reduction may be especially problematic in the context of high speed memories and high speed devices

SUMMARY OF THE PRESENT INVENTION

The present invention provides a method and an integrated circuit as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects, and embodiments of the invention will be described, by way of example only, with reference to the drawings.

DETAILED DESCRIPTION OF THE DRAWINGS

In the following specification, the invention will be explained with reference to specific examples of embodiments of the invention. It will, however, be evident that various modifications and changes may be made therein without departing from the broader spirit and scope of the invention as set forth in the appended claims.

Because the described example may, for the most part, composed of electronic components and circuits known to those skilled in the art, circuit details will not be explained in any greater extent than that considered necessary, for the understanding and appreciation of the underlying concepts of the present invention and in order not to obfuscate or distract from the teachings of the present invention.

Figure 1:
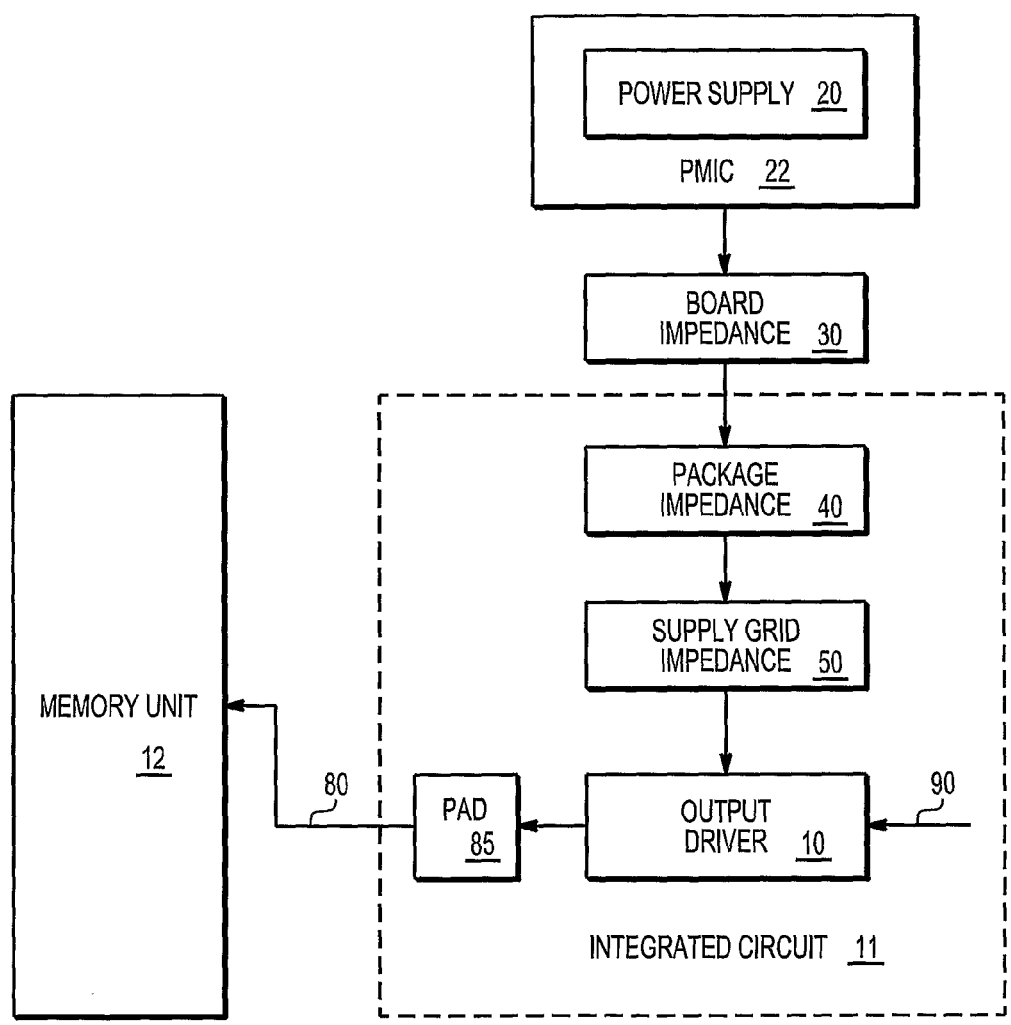
FIG. 1 schematically shows an example of an electronic device.

FIG. 1 schematically shows an electronic device 8. Device 8 includes an integrated circuit 11, a memory unit 12 and a power management integrated circuit PMIC 22. Integrated circuit 11 includes an output driver 10, a line 90 and an IO pad 85. The PMIC 22 includes a power supply 20. The PMIC 22 is connected, via one or more on-board conductors to the integrated circuit 11.

In FIG. 1 three boxes 30, 40 and 50 are shown, representing respective impedances. Box 30 (denoted "board impedance") represents a complex impedance of one or more on-board conductors through which PMIC 22 provides the supply voltage to integrated circuit 11. The complex impedances 30, 40 and 50 may include parasitic inductance elements. These complex impedances may also include parasitic capacitance elements.

Box 40 (denoted "package impedance") represents a complex impedance of the package of integrated circuit 11. Box 50 (denoted "supply grid impedance") represents the complex impedance of the supply grid that is connected between the package of integrated circuit 11 and output driver 10. The supply grid may include one or more conductors, switches, passive elements and, additionally or alternatively, active elements.

The output driver 10 is connected to an IO pad 85 and drives a line 80. The line 80 is connected between the IO pad 85 and the memory unit 12. The output driver 10 receives a driven input signal over line 90 from an internal component 503 integrated circuit 11. The internal component 503 can for example be a signal source, a processor, a DMA controller, an internal memory unit and the like.

A change in an output signal that is driven by the output driver 10 results in a fast increment of the current consumed by the output driver 10. This fast increment in the current consumption causes the complex impedances 30, 40 and 50 to oscillate and introduce oscillations in the supply voltage that is received by the output driver 10. The oscillation is at least partially contributed to the parasitic inductance element of at least one of the complex impedances. The voltage developed on such a parasitic inductance element is responsive to a rate of change (dI/dt) of the current consumed from the power grid by the output driver 10.

Figure 2:
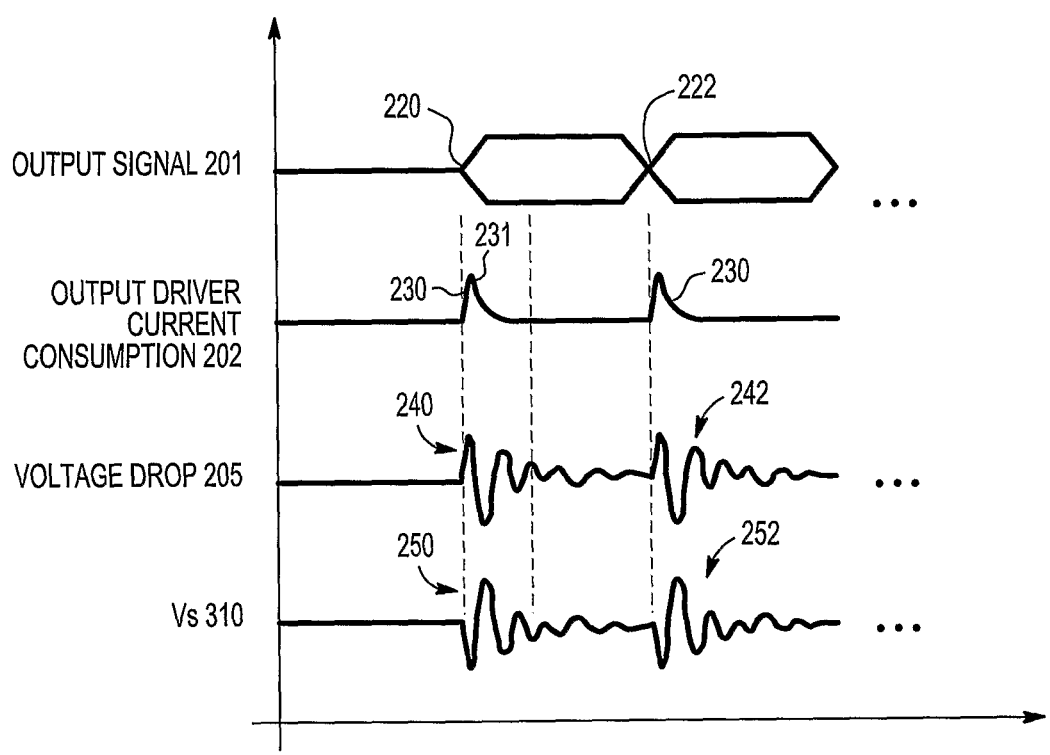
FIG. 2 schematically shows graphs of the development of parameters of the device of FIG. 1 as a function of time.

FIG. 2 schematically shows multiple graphs that illustrate the output signal 201, the output driver current consumption 202, the voltage drop 205 and the supply voltage (Vs) 310 as a function of time t.

FIG. 2 shows changes 220 and 222 in an output signal driven by output driver 10. The changes 220 and 222 cause fast changes in the current consumed by the output driver 10 as illustrated by two instances 230 of an output signal change induced in the output driver current consumption 202.

Each current consumption pattern induced by the output signal change 230 includes a fast increment of the current consumption that is followed by a slower decrement of the current consumption. Each instance of the current consumption pattern results in constrained oscillations such as oscillations 240 and 242 of the voltage 205 (also referred to as voltage drop) developed on complex impedances 30, 40 and 50. These oscillations in turn result in changes 250 and 252 in the supply voltage (Vs 310) that is received by output driver 10.

In the following, the term "output signal change induced current consumption pattern" refers to the manner in which an output driver changes its current consumption in response to a change in an output signal that is being outputted by the output driver.

Figure 3:
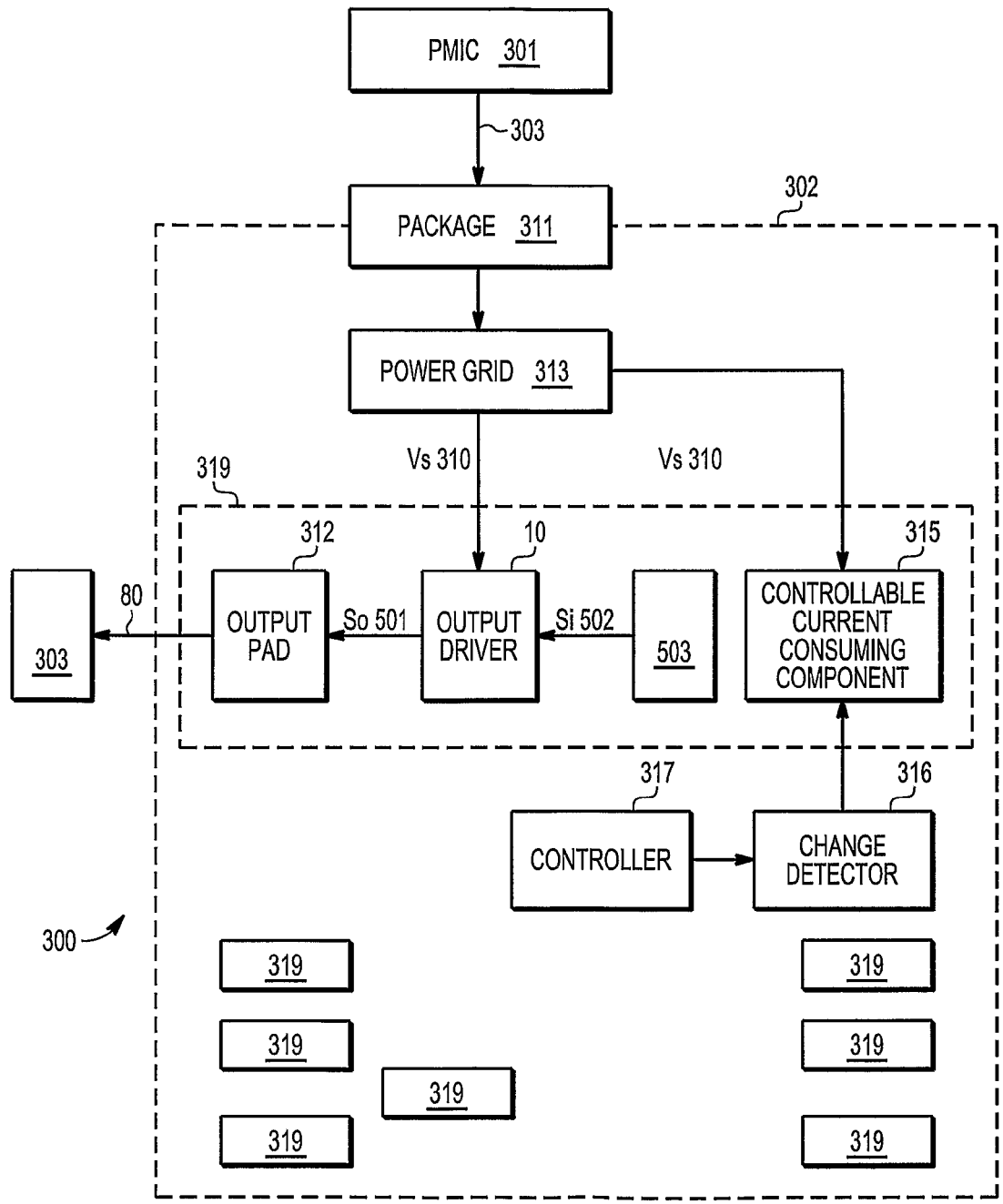
FIG. 3 schematically shows a block diagram of an example of an embodiment of an electronic device.

FIG. 3 illustrates an example of an embodiment of an electronic device 300. The electronic device 300 includes a PMIC 301, a first integrated circuit 302, a second integrated circuit 303, an on-board conductor 304 and a line 80.

The first integrated circuit 302 sends an output signal (such as an address signal, a data signal, a control signal and the like) to the second integrated circuit 303 over the line 80. It is noted that either one of integrated circuits 302 and 303 may send multiple output signals over multiple lines, using multiple pads. For simplicity of explanation FIG. 3 illustrates only a single line 80.

The first integrated circuit 302 includes a package 311, a power grid 313, multiple output circuits 319, a change detector 316 and a controller 317.

Each output circuit 319 may include an output driver 10, an output pad 312 and a controllable current consuming component 315. For simplicity of explanation, FIG. 3 shows the content of a single output circuit 319 as including a single output driver 10, a single output pad 312 and a single controllable current consuming component 315. It is noted that the output circuit 319 may include multiple output drivers and, additionally or alternatively, multiple controllable current consuming components.

The controllable current consuming component 315 may, for example, be a CMOS transistor and its conductance may be controlled by the change detector 316. For example, the controllable current consuming component 315 may be a CMOS transistor connected with its gate to the change detector 316, to receive from the change detector 316, a gate control signal that determines the conductivity of the CMOS transistor. This gate control signal determines the current consumed by the CMOS transistor. It is noted that any other type of controlled current consuming component may be used, such as one or more transistors, capacitors, resistors and the like.

The controllable current consuming component 315 and the output driver 10 are connected to the power grid 313. The power grid 313 supplies a supply voltage (Vs 310) to the output driver 10 and to the controllable current consuming component 315. As will be illustrated below, the controllable current consuming component 315 consumes current in order to reduce the changes in supply voltage that result in a change in the output signal outputted from output driver 10.

The supply voltage change reduction pattern may, for example, increase the current from the power grid prior to the change in the output signal and start decreasing when the current consumption increases due to the change in the output signal, such that this increase is at least partially counteracted.

The output driver 10 converts, when in operation, a driven output signal (Si 502) to an output signal (So 501). Accordingly, to the output driver 10 converts a change in the driven output signal Si 502 to a change in the output signal So 502. The change can be a change from one level to another level, such as a high-to-low change or a low-to-high change. The output driver 10 may consume a maximum amount of power when a change occurs and consume a minimum (even zero) power while output signal So 501 maintains unchanged.

Figure 4:
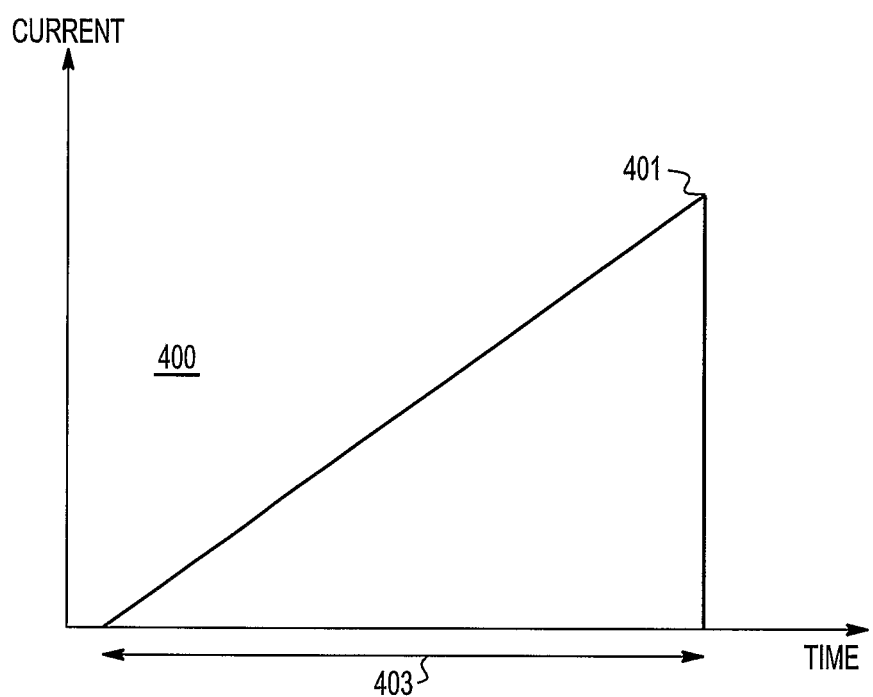
FIG. 4 schematically shows an example of a supply voltage change reduction pattern.

The change detector 316 is arranged to detect a future change in the driven output signal Si 502, and trigger the controllable current consuming component 315 to consume current in accordance with a supply voltage change reduction pattern (denoted 400 in FIG. 4). The supply voltage change reduction pattern 400 is designed to reduce the change in the supply voltage Vs 310 resulting from the change in the output signal Si 502.

The triggering may include sending one or more control signals that affect the current consumption of controllable current consuming component 315, in accordance with the pattern 400.

The supply voltage change pattern 400 may have any shape suitable to reduce the change in the supply voltage Vs 310. The pattern 400 may, for example, increment from an initial value to a peak value and thereafter decrement from the peak value to the initial value. Also the number (Q) of controllable current consuming component can be equal to the number (R) of output drivers and the number (S) of change detectors of first integrated circuit 302. It is noted that these numbers (Q, R and S) may alternatively differ from each other. For example, a single controllable current consuming component can be allocated per each output driver.

Figure 5:
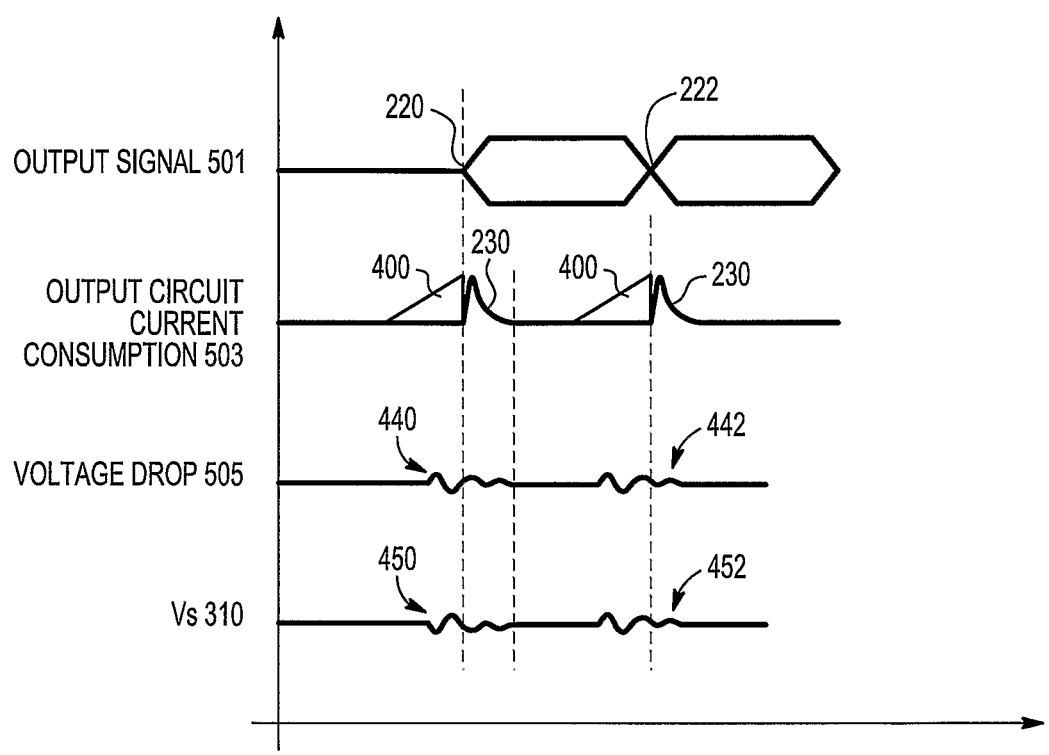
FIG. 5 schematically shows a graph of the development of various parameters of the example of FIG. 3 as a function of time.

As illustrated in FIGS. 4 and 5, The supply voltage change reduction pattern 400 can, for instance, include an increment in the current drained from the power grid 313 slightly before the output driver 10 changes its output signal.

As illustrated in FIGS. 4 and 5, the supply voltage change reduction pattern 400 may have a lower current change rate (at least when the current is being increased) than the change rate of the output signal change induced current consumption pattern of the output driver 10. Especially, the supply voltage change reduction pattern may be have a lower current increment change rate than the current increment change rate of the output signal change induced current consumption pattern of the output driver 10.

The supply voltage change reduction pattern 400 may include a steep decrement in the current consumption at the end of a current consumption period, defined by the pattern 400. The steep decrement may occur substantially concurrently to a steep increment in current consumed by the output driver that is responsive to a change in the output signal.

The supply voltage change reduction pattern 400 can include a maximal (peak) value 401 that may substantially equal the peak 321 of the output signal change induced current consumption pattern 230 of output driver 10. These peaks may differ from each other by a fraction (for example, 5% or less, 10% or less, 20% or less, 30% or less) of a peak.

The supply voltage change reduction pattern 400 can include an end point during which the controllable current consuming component 315 stops to consume current or starts to consume only (for the specific application) an insignificant amount of current. The end point can be aligned to the change in the output signal, can precede the change in the output signal but can also follow the change in the output signal. FIG. 4 illustrates an end point that occurs immediately after reaching peak 401. It should be noted that FIG. 4 represents an ideal supply voltage change reduction pattern 400 and that in practice, some time will lapse before the end point is reached after the peck.

The supply voltage change reduction pattern 400 can be designed to provide a tradeoff between power consumption (e.g. the aggregate power consumed by the controllable current consuming component during the current consumption period) and a desired amount of reduction in the supply voltage changes resulting from the change in the output signal. As a rule of thumb, larger reductions in the supply voltage changes may require the controllable current consuming component 315 to consume more current. One of these requirements (power consumption, desired amount of reduction) may be set and it may determine the other parameter. The desired amount of reduction may be set in dependence on the desired operational frequency of output driver 10. A designer may be requested to facilitate a certain operational frequency, and select an amount of reduction which enables operating at that frequency and the power consumption.

The duration (in time) of the current consumption period as well as the slope of the current consumption may be determined to achieve the desired tradeoff. Longer periods may result in a more moderate slope and a higher reduction in changes in the supply voltage.

FIG. 4 schematically shows an example of supply voltage change reduction pattern 400 and an output signal change induced current consumption pattern 234. The supply voltage change reduction pattern 400 of FIG. 4 has a ramp. The controllable current consuming component 315 gradually increases its current consumption (starting from zero) until it reaches a peak level 401 that, in this example, substantially equals the peak 231 of output signal change induced current consumption pattern 234. Immediately after supply voltage change reduction pattern 400 reaches the peak 401, the current consumption stops.

The supply voltage change reduction pattern 400 of FIG. 4 defines a current consumption period 403 during which the controllable current consuming component 315 consumes current. The current consumption period 403 may precede the change in the output signal and may be proximate to the change in the output signal.

Stopping the current consumption (of controllable current consuming component 315) when the output driver 10 increases its current consumption may contribute to the smoothness of a combined current pattern that represents the overall current consumption of the output circuit 319. This stopping may balance a possible increase of the overall current consumption of the output circuit 319 due to the current consumption associated with the change of the output signal.

The combined current consumption of the output driver and the controllable current consuming component is smoother than an output signal change induced current consumption pattern of the output driver, wherein the output signal change induced current consumption pattern results from a change in the output signal.

Supply voltage change reduction pattern 400 can have any suitable shape. Non-limiting examples, include a shape with a linear increase or decrease, a multiple-facet shape and a curved shape. The supply voltage change reduction pattern 400 can have a current change rate (slope) that is lower then a threshold that may represent the slope of the current increment of the output signal change induced current consumption pattern 230.

FIG. 5 schematically shows multiple graphs that illustrate the output signal 501, the output circuit current consumption 503, the voltage drop 505 and the supply voltage (Vs) 310.

FIG. 5 shows changes (reference numbers 220 and 222) in an output signal Si 310 that is driven by the output driver 10. The changes 220, 222 are preceded in time by instances of supply voltage change reduction pattern 400. The current 503 that is drained by the output circuit 219 is a sum of the current that is drained by the controllable current consuming component 315 and by the output driver 10. It is illustrated in graph 503.

As can be seen in FIG. 5, the consumption of current by the controlled current consuming component 315 results in a decrease in the voltage drops 440 and 442. This decrement reduces the changes in the supply voltage (Vs 310) that is received by output driver 10.

As FIG. 5 shows, due to the pattern 400, each change in the output signal So 502 results in non-significant constrained oscillations such as non-significant oscillations 440 and 442 of the voltage (voltage drop) developed on the complex impedances 30, 40 and 50. These oscillations result in non-significant changes 450 and 452 in the supply voltage (Vs 310) that is received by output driver 10.

Referring back to FIG. 3, the change detector 316 is capable of detecting a future change in the driven output signal before the change in the driven output signal is received by the output driver 10. Additionally or alternatively, the change detector 316 may be capable of detecting the future change before the change in the driven output signal is converted to a change in the output signal of the output driver 10.

The change detector 316 may, for example, receive the driven output signal before the driven output signal is provided to the output driver 10. The change detector 316 can be connected to a signal provider such as the controller 317. The controller 317 may be configured to send to the change detector 316 the driven output signal before it sends that driven output signal to the output driver 10. The output driver 10 may receive a delayed version of the input signal. The controller 317 may be a general purpose processor, a communication controller, a memory controller, a digital signal processor or any other component that can receive or generate the driven output signal and control the timing with which the driven output signal is sent to the output driver 10 and be converted to an output signal. The driven output signal can be generated in advance and temporarily stored in a memory unit before being sent to the second integrated circuit 303.

The change detector 316 can access the controller 317 and check for changes in the driven output signal before the driven output signal is sent to output driver 10. The change detector 316 may e.g. compare (for example by applying a XOR operation) between values of the driven output signal at different points of time. The detector 316 may compare between a current value and a future value or of the driven output signal Si 502, compare between an old value of driven output signal and a current value of input signal, and the like.

The controller 317 may coordinate between the triggering of the controllable current consuming component 315 and the change of the output signal.

The time difference between the change of the output signal So 501 by the output driver 10 and the change sensed by the change detector 316 may depend on the specific implementation and may be long enough to allow the controllable current consuming component 315 to start and drain current in accordance with the supply voltage change reduction pattern, before the output driver 10 changes the output signal.

The time difference may be long enough to allow the controllable current consuming component 315 to complete a supply voltage change reduction pattern 400, before the output driver 10 changes the output signal. For example, for a pattern of duration $T_1$, the time difference may be $T_1+T_{exec}$, with $T_{exec}$ being the time it takes for the output driver to change the output signal after receiving the change.

Yet for another example, a single controllable current consuming component consuming component can be allocated per multiple output drivers. In this case one or more change detectors can monitor multiple input signals that are provided to the multiple output drivers and control the controllable current consuming component to consume current in response to one or more future concurrent changes.

Assuming, for example, that a controllable current consuming component can be allocated to N output drivers then the supply voltage change reduction pattern can be designed to compensate for up to N concurrent output signal changes. For example, the peak of a supply voltage change reduction pattern of such a controllable current consuming component may be substantially equal to N peaks of output signal change induced current consumption patterns of a single output driver.

Figure 6:
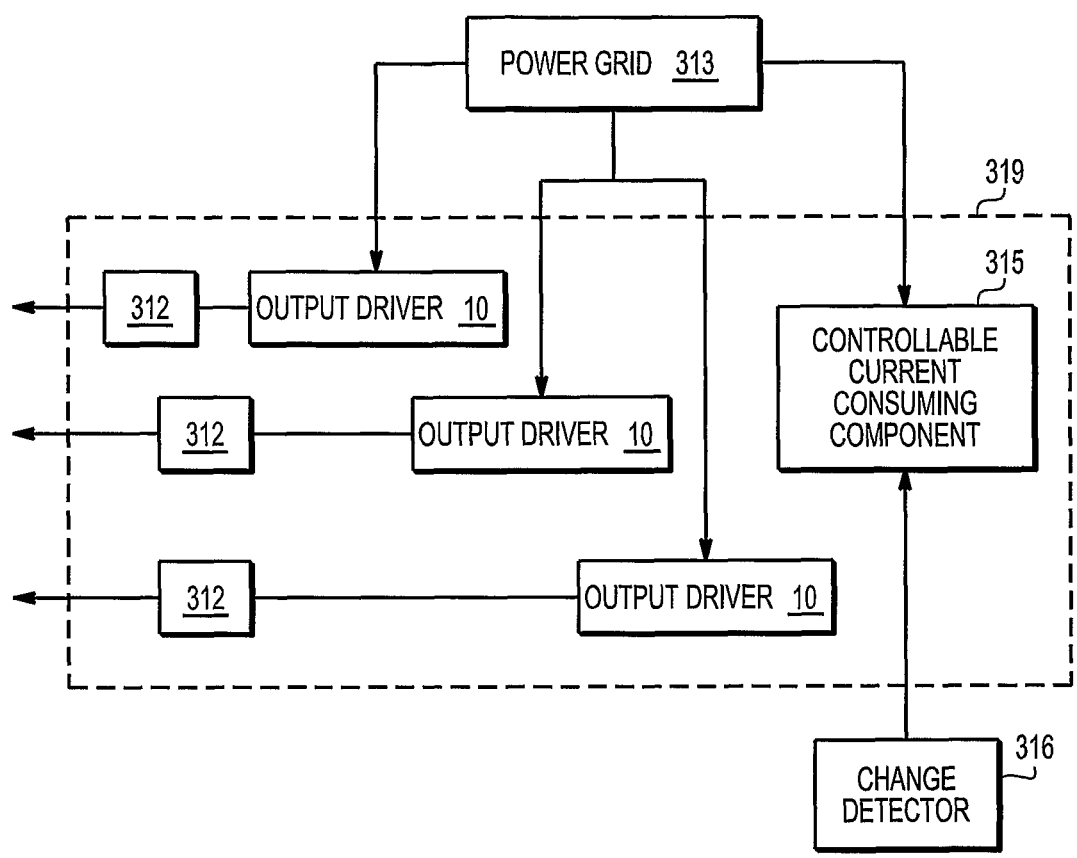
FIG. 6 schematically shows a block diagram of an example of an embodiment of an output circuit, a change detector and a second power grid.

FIG. 6 schematically shows an example of an embodiment of an output circuit 319, a change detector 316 and a power grid 313. For sake of brevity, those parts are similar to the example of FIG. 3 are not described in further details. The output circuit 319, shown in FIG. 6, includes a plurality of (N) output drivers 10 and a single controllable current consuming component 315. The single controllable power consuming component 315 is connected to change detector 316.

The output drivers 10 convert (in operation) changes in a plurality of input signals to changes in a plurality of output signals. The change detector 316 is configured to detect a plurality (2 till N) of concurrent future changes in the plurality of input signals, and to trigger by the controllable current consuming component 315 to current consumption in accordance with the supply voltage change reduction pattern.

The change detector 316 can also detect a single future change in the plurality of input signals, and trigger the controllable current consuming component 315 to consume current in accordance with the supply voltage change reduction pattern. The supply voltage change reduction pattern 400 is designed to reduce a change in the supply voltage resulting from a plurality of concurrent changes in the plurality of output signals. It may be designed to compensate for up to N concurrent changes in the output signals, N being a positive integer, smaller from or equal to the number of output drivers.

Figure 7:
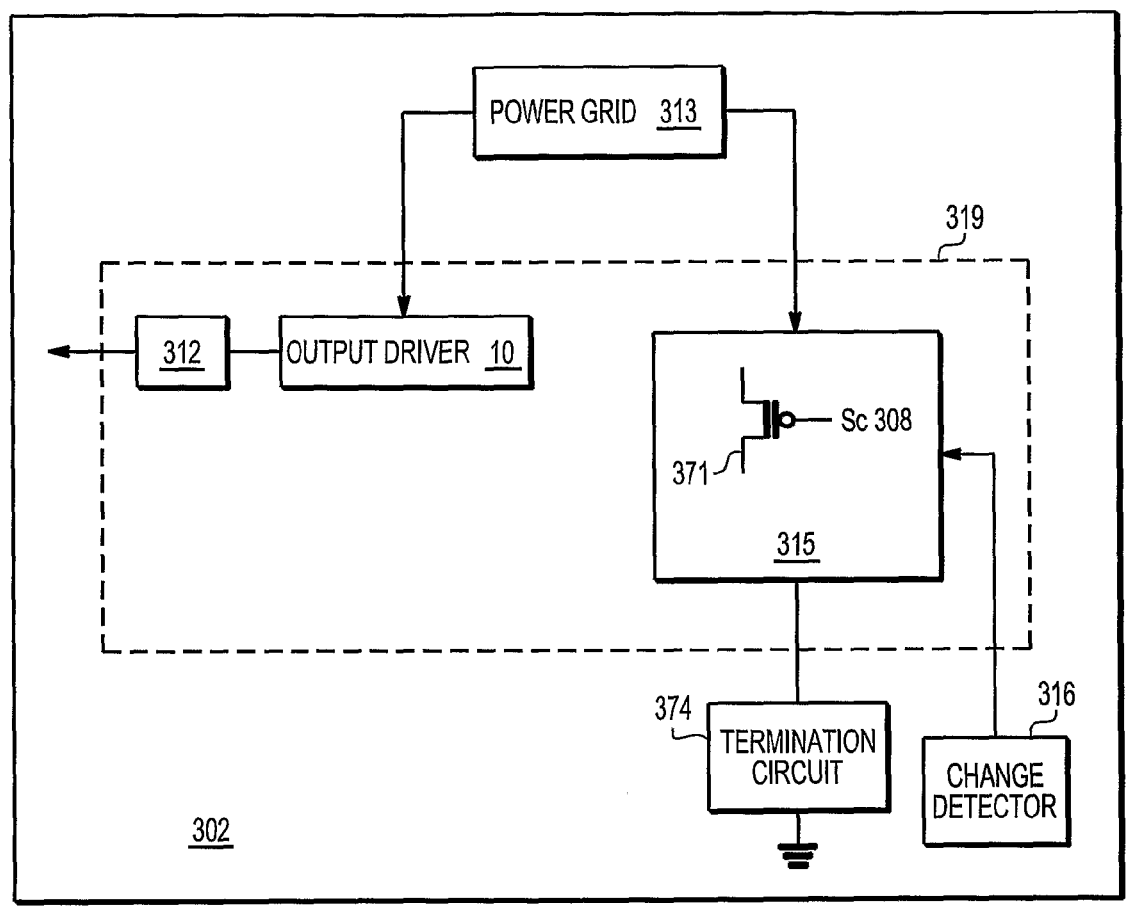
FIG. 7 schematically shows a block diagram of an example of an embodiment of an output circuit, a change detector a termination circuit and power grid.

FIG. 7 schematically shows an example of an embodiment of an output circuit 319, a change detector 316, a second power grid 330 and a termination circuit 374. The output circuit 319 includes a pad 312, an output driver 310 and a controllable current consuming component 315. For sake of brevity, those parts are similar to the example of FIG. 3 are not described in further details.

The controllable current consuming component 315 shown in this example as includes PMOS transistor 371 that receives a control signal (Sc 308) to its gate. The control signal Sc 308 can be provided by the change detector 316 or can be generated by a control circuit of the controllable current consuming component 315. The control signal (Sc 308) determines the conductivity of the PMOS transistor 371 and hence its current consumption.

The PMOS transistor 371 is also connected via a termination circuit 374 to the ground. The termination circuit 374 may e.g. include a resistor which connects the PMOS transistor 371 to the ground.

It is noted that the termination circuit 374 can be connected to either one of the output circuits 319 of FIG. 3 or 6.

It is noted that PMOS transistor 371 or an equivalent circuit (for example an NMOS transistor) can belong to any of the mentioned above controllable current consuming components 315.

Figure 8:
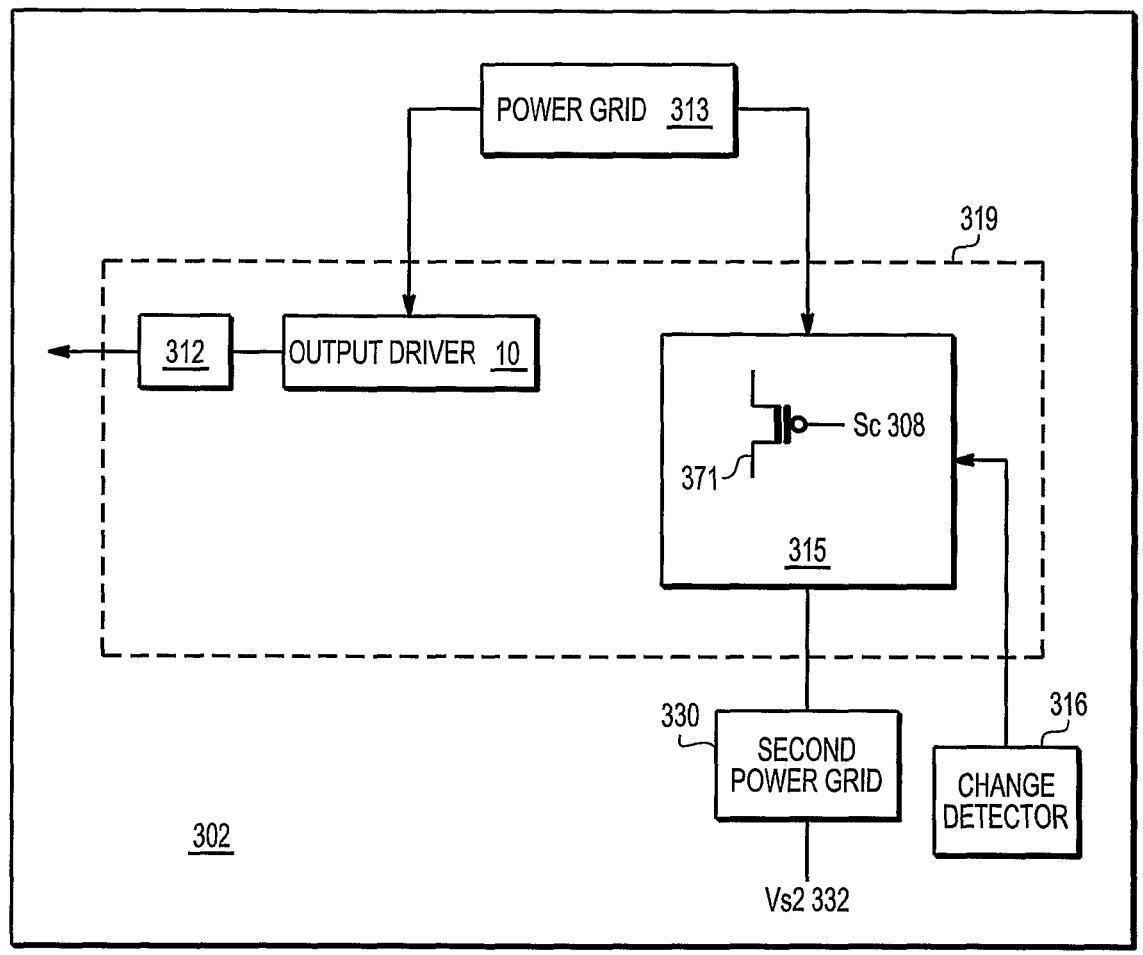
FIG. 8 schematically shows a block diagram of an example of an embodiment of an output circuit, a power grid, a change detector, and a second power grid.

FIG. 8 schematically shows an example of an embodiment of an output circuit 319, a change detector 316, a second power grid 330 and a power grid 313. For sake of brevity, those parts are similar to the example of FIG. 3 are not described in further details.

The output circuit 319, shown in FIG. 8, includes a controllable current consuming component 315 (it will be apparent that more than one may be used) that consume current and provides to the second power grid 330 a voltage that is lower than supply voltage Vs 310. The second power grid 330 supplies a supply voltage (Vs2) 332 to other components (not shown) of the integrated circuit 302. Supply voltage Vs2 332 is lower than the supply voltage (Vs 310) provided by power grid 313.

Figure 9:
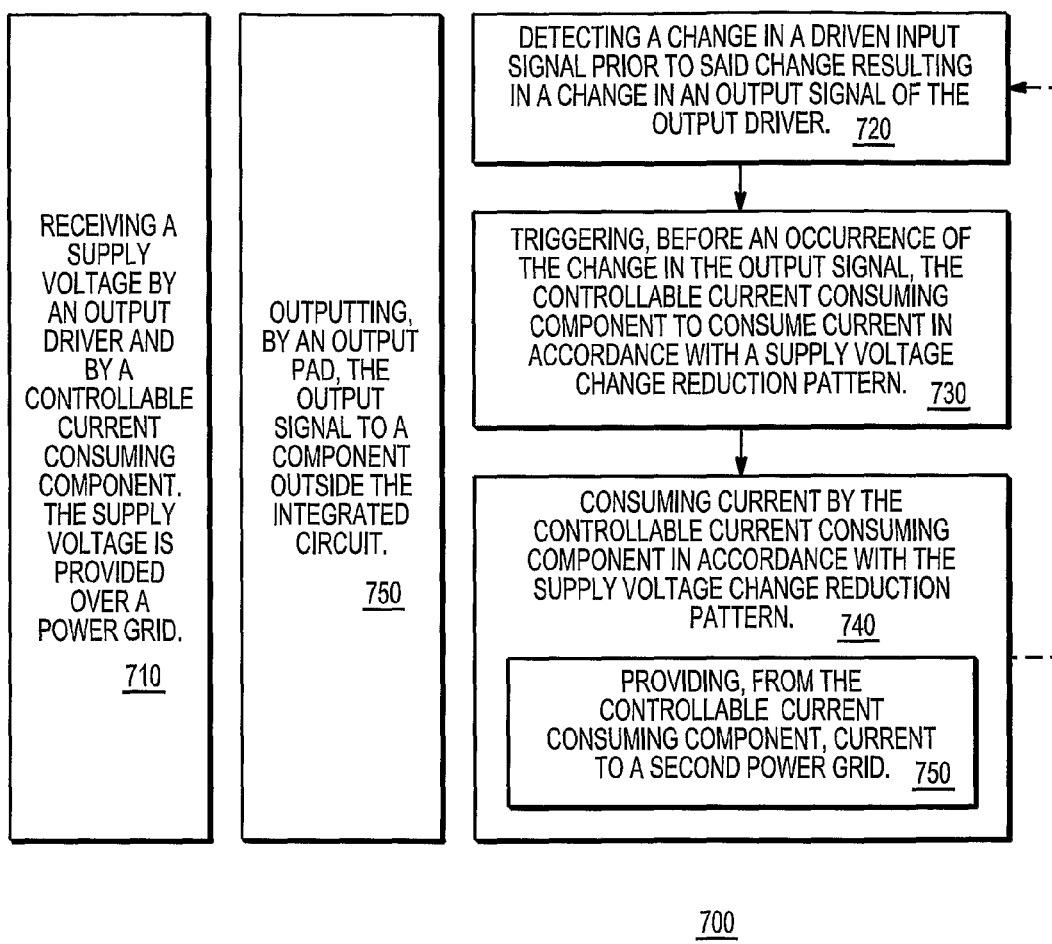
FIG. 9 schematically shows a flow-chart of an example of a method for controlling a supply voltage.

FIG. 9 schematically shows a flow-chart of an example of a method 700.

The illustrated method 700 includes stages 710, 720, 730, 740 and 750 and may for example be performed with the electronic devices of FIG. 3, 6, 7 or 8.

Stage 710 includes receiving a supply voltage by an output driver and by a controllable current consuming component. The supply voltage is provided over a power grid.

As illustrated with block 720, the method includes detecting a change in a driven input signal prior to said change resulting in a change in an output signal of the output driver.

Stage 720 may include monitoring future values of the driven input signal. The monitoring may be executed by a change detector, e.g. by monitoring a driven input signal which is provided to the output driver with a delay. It will be apparent that the supply voltage may be provided with harmony the monitoring, the triggering and the consuming current.

Stage 730 includes triggering, before an occurrence of the change in the output signal, the controllable current consuming component to consume current in accordance with a supply voltage change reduction pattern. The supply voltage change reduction pattern is designed to reduce a change in the supply voltage resulting from the change in the output signal.

Stage 740 includes consuming current by the controllable current consuming component in accordance with the supply voltage change reduction pattern.

Stage 750 includes outputting, by an output pad, the output signal to a component outside the integrated circuit.

It will be apparent that the monitoring may be performed more or less continuously and that the triggering may be performed in response to detecting the change. The monitoring may be stopped during the performance of stages 730, 740 and recommence thereafter or be continued during stages 730, 740.

The consumption of current may for example be performed during a current consumption period that precedes (or at least almost entirely precedes) the change in the output signal and is proximate to the change in the output signal.

The method may include alter stages, such as converting, by the output driver, the change in the driven output signal to the change in the output signal. Stage 740 may also include providing, from the controllable current consuming component, current to a second power grid.

The method 700 may for example be executed by the first integrated circuit 302 of FIG. 3 but may also be performed by the second integrated circuit 303 of FIG. 3. or any of the circuits of FIGS. 6, 7 and 8.

Although the mentioned above description refers to a change of a single output signal, it is noted that the method may be applied to a plurality of concurrent changes in multiple output signals. In this case, stage 720 may include detecting a plurality of concurrent changes in multiple input signals before the plurality of changes are converted to a plurality of concurrent changes in multiple output signals. Stage 730 may then include triggering, before an occurrence of the plurality of concurrent changes in the output signals, at least one controllable current consuming component to consume current in accordance with the supply voltage change reduction pattern, wherein the supply voltage change reduction pattern is designed to reduce a change in the supply voltage resulting from the plurality of concurrent changes in the multiple output signals. Also, in such a case, stage 740 may include consuming current by the controllable current consuming component in accordance with the supply voltage change reduction pattern wherein the current consumption is responsive to the number of concurrent changes of output signals. It will be apparent that the examples described herein before are merely illustrative and that other embodiments can be conceived as well. The first integrated circuit 302 may, for instance, include multiple output circuits, one or more controllable current consuming components, one or more change detectors, and the like. Also the number (Q) of controllable current consuming components can be equal to the number (R) of output drivers and the number (S) of change detectors of first integrated circuit 302. It is noted that these numbers (Q, R and S) may alternatively differ from each other. For example, a single controllable current consuming component can be allocated per each output driver.

Those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Thus, it is to be understood that the architectures depicted herein are merely exemplary, and that in fact many other architectures can be implemented which achieve the same functionality.

In addition, the devices may be physically distributed over a number of devices, while functionally operating as a single device.

However, other modifications, variations, and alternatives are also possible. The specifications and drawings are, accordingly, to be regarded in an illustrative rather than in a restrictive sense.

The word 'comprising' does not exclude the presence of other elements or steps then those listed in a claim.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

We claim:

1. An integrated circuit, comprising:
    an internal component having an output for providing a driven input signal;
    an output driver, connected to the internal component, for converting said driven input signal in an output signal;
    an output pad for outputting said output signal to a component outside the integrated circuit;
    a power grid configured to supply a supply voltage to the output driver;
    a controllable current consuming component connected to the power grid, said controllable current consuming component being controllable to consume current in accordance with a supply voltage change reduction pattern to temporarily increase overall current provided from the power grid responsive to detecting a change in said driven input signal; and
    a change detector connected to the internal component and the controllable current consuming component, for detecting a change in said driven input signal prior to said change resulting in a change in said output signal and to control said current consuming component to consume current in response to said detecting.

2. The integrated circuit according to claim 1, wherein the controllable current consuming component is being controllable to consume current during a current consumption period that precedes the change in the output signal and ends in proximity to the change in the output signal.

3. The integrated circuit according to claim 1, wherein the supply voltage change reduction pattern exhibits a current change rate that is lower than a current change rate of an output signal change induced current consumption pattern of the output driver, wherein the output signal change induced current consumption pattern results from a change in the output signal.

4. The integrated circuit according to claim 1, wherein the supply voltage change reduction pattern exhibits a gradual increase in a current consumption.

5. The integrated circuit according to claim 1, wherein the supply voltage change reduction pattern exhibits a maximal current consumption level that substantially equals a peak of an output signal change induced current consumption pattern.

6. The integrated circuit according to claim 1, comprising:
    multiple output drivers configured to convert changes in multiple driven input signals to changes in multiple output signals, and
    at least one change detector that is configured to detect a plurality of concurrent changes in said driven input signals prior to said changes resulting in changes in said multiple output signals and to control said current consuming component to consume current in response to said detecting.

7. The integrated circuit according to claim 1, comprising multiple output circuits; wherein each output circuit comprises a controllable current consuming component and an output driver, wherein each output circuit is coupled to a single change detector and to the power grid.

8. The integrated circuit according to claim 1, wherein a combined current consumption of the output driver and the controllable current consuming component is smoother than an output signal change induced current consumption pattern of the output driver, wherein the output signal change induced current consumption pattern results from a change in the output signal.

9. The integrated circuit according to claim 1, comprising a controller that controls a timing of a provision of an output signal by the output driver; wherein the controller provides to the change detector information indicative of future values of the driven input signal.

10. The integrated circuit according to claim 1, wherein the controllable current consuming component provides power to a second power grid.

11. A method, comprising:
receiving a supply voltage by an output driver and a controllable current consuming component of an integrated circuit;
detecting a change in a driven input signal prior to said change resulting in a change in an output signal of the output driver;
triggering, before an occurrence of the change in the output signal, the controllable current consuming component to consume current in accordance with a supply voltage change reduction pattern to temporarily increase overall current provided from the voltage supply responsive to the detecting the change in the driven input signal;
consuming current by the controllable current consuming component in accordance with the supply voltage change reduction pattern;
converting, by the output driver, the change in the driven input signal to a change in the output signal; and
outputting, by an output pad, the output signal to a component outside the integrated circuit.

12. The method according to claim 11 comprising consuming current during a current consumption period that precedes the change in the output signal and ends in proximity to the change in the output signal.

13. The method according to claim 11, wherein the supply voltage change reduction pattern exhibits a current change rate that is lower than a current change rate of an output signal change induced current consumption pattern of the output driver, wherein the output signal change induced current consumption pattern results from a change in the output signal.

14. The method according to claim 11, wherein the supply voltage change reduction pattern exhibits a gradual increase in a current consumption.

15. The method according to claim 11, wherein the supply voltage change reduction pattern exhibits a maximal current consumption level that substantially equals a peak of an output signal change induced current consumption pattern.

16. The method according to claim 11, comprising:
converting changes in multiple driven input signals to changes in multiple output signals by multiple output drivers;
detecting, by at least one change detector, a plurality of concurrent changes in said driven input signals prior to said changes resulting in changes in said multiple output signals; and
controlling said current consuming component to consume current in response to said detecting.

17. The method according to claim 11, wherein a combined current consumption of the output driver and the controllable current consuming component is smoother than an output signal change induced current consumption pattern of the output driver, wherein the output signal change induced current consumption pattern results from a change in the output signal.

18. The method according to claim 11, comprising controlling a timing of a provision of an output signal by the output driver; and providing information indicative of future values of the driven input signal.

19. An integrated circuit, comprising:
a power grid;
a first output driver coupled to the power grid, the first output driver to convert a first input signal to a first output signal;
a second output driver coupled to the power grid, the second output to convert a second input signal to a second output signal;
a current component coupled to the power grid, the current component to increase a current provided from the power grid; and
a change detector coupled to the current component, the change detector to:
detect a first change in the first input signal prior to the first change resulting in a change in the first output signal;
detect a second change in the second input signal prior to the second change resulting in a change in the second output signal; and
control the current component to increase the current, wherein when the change detector detects only one of the first change and the second change, the change detector controls the current component to increase the current in accordance with a first pattern, and when the change detector detects both of the first change and the second change, the change detector controls the current component to increase the current in accordance with a second pattern.

20. The integrated circuit according to claim 1, wherein the output driver receives a delayed version of said driven input signal.

* * * * *